United States Patent
Davis (10) Patent No.: US 10,149,411 B2
(45) Date of Patent: Dec. 4, 2018

(54) RACK ENCLOSURE COOLING SYSTEMS AND RELATED METHODS

(71) Applicant: Seagate Technology LLC, Cupertino, CA (US)

(72) Inventor: David Michael Davis, Portsmouth (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/260,595

(22) Filed: Sep. 9, 2016

(65) Prior Publication Data

US 2018/0077820 A1    Mar. 15, 2018

(51) Int. Cl.
*H05K 7/20*      (2006.01)

(52) U.S. Cl.
CPC ...... *H05K 7/20745* (2013.01); *H05K 7/2079* (2013.01); *H05K 7/20736* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 3,848,426 A | 11/1974 | Whitney | |
| 4,768,581 A * | 9/1988 | Gotwald | H01L 23/467 165/80.3 |
| 6,109,607 A | 8/2000 | Cartwright et al. | |
| 6,506,111 B2 | 1/2003 | Sharp et al. | |
| 6,525,935 B2 | 2/2003 | Casebolt | |
| 6,764,409 B1 | 7/2004 | Voden | |
| 7,898,805 B2 * | 3/2011 | MacDonald | G06F 1/203 165/104.33 |
| 2004/0264124 A1* | 12/2004 | Patel | G06F 1/20 361/679.46 |
| 2005/0248922 A1* | 11/2005 | Chu | H05K 7/20727 361/700 |
| 2005/0252672 A1* | 11/2005 | Kleinecke | H05K 7/20572 174/17 VA |

(Continued)

*Primary Examiner* — Anthony M Haughton
*Assistant Examiner* — Razmeen Gafur
(74) *Attorney, Agent, or Firm* — Mueting, Raasch & Gebhardt, P.A.

(57) ABSTRACT

A system includes an enclosure with a device space having a layer of active devices arranged into rows and adjacent cooling channels and an inlet partition having apertures aligned to the cooling channels defining a supply plenum. In a method of use, cooling fluid, such as air, is transferred from the supply plenum to the cooling channels to concurrently cool the layer of active devices and may provide substantially the same temperature and flow of cooling fluid to each row of active devices. Active devices may include storage devices. The supply plenum may include elongate ducts to encourage uniform cooling along a row. The supply plenum may also include a duct partition or more than one supply plenum to encourage uniform cooling among the rows. One or more fans may provide pressurized cooling fluid in the supply plenum space.

23 Claims, 10 Drawing Sheets

(56) References Cited

U.S. PATENT DOCUMENTS

| | | | |
|---|---|---|---|
| 2005/0254214 A1* | 11/2005 | Salmon | H01L 23/473 361/699 |
| 2006/0204358 A1* | 9/2006 | Guzorek | F04D 29/4253 415/169.2 |
| 2007/0053154 A1* | 3/2007 | Fukuda | G11B 33/022 361/679.33 |
| 2007/0235180 A1* | 10/2007 | Ouyang | H01L 23/473 165/287 |
| 2008/0209931 A1* | 9/2008 | Stevens | H05K 7/20763 361/699 |
| 2008/0266794 A1* | 10/2008 | Malone | H05K 7/20745 361/695 |
| 2008/0273306 A1* | 11/2008 | Campbell | H05K 7/20745 361/698 |
| 2009/0279259 A1* | 11/2009 | Cripe | H05K 1/0272 361/699 |
| 2009/0308579 A1* | 12/2009 | Johnson | H05K 7/20736 165/104.34 |
| 2011/0013357 A1* | 1/2011 | Tye | G06F 1/20 361/679.47 |
| 2011/0026225 A1* | 2/2011 | Ostwald | H05K 7/20645 361/699 |
| 2011/0105010 A1 | 5/2011 | Day | |
| 2011/0134604 A1* | 6/2011 | Attlesey | G06F 1/20 361/679.47 |
| 2011/0317367 A1* | 12/2011 | Campbell | H05K 7/20809 361/700 |
| 2012/0085122 A1* | 4/2012 | Thour | H05K 7/206 62/419 |
| 2012/0155025 A1* | 6/2012 | Bourgeois | H01M 10/399 361/694 |
| 2013/0077238 A1* | 3/2013 | Babish | H01L 23/473 361/689 |
| 2013/0141868 A1* | 6/2013 | Ek | H05K 7/20163 361/694 |
| 2013/0265720 A1* | 10/2013 | Thijs | F28F 1/006 361/704 |
| 2014/0020394 A1* | 1/2014 | Laing | F02C 7/00 60/772 |
| 2014/0078667 A1* | 3/2014 | Ashby | G06F 1/20 361/679.46 |
| 2014/0138068 A1* | 5/2014 | Nienberg | H05K 7/20909 165/121 |
| 2014/0233175 A1* | 8/2014 | Demange | H05K 7/20254 361/679.47 |
| 2014/0319984 A1 | 10/2014 | Younts | |
| 2014/0355201 A1* | 12/2014 | Alshinnawi | H05K 7/20736 361/679.47 |
| 2014/0355203 A1* | 12/2014 | Kondo | H05K 7/20745 361/679.51 |
| 2014/0362520 A1* | 12/2014 | Alshinnawi | H05K 7/20781 361/679.47 |
| 2015/0016056 A1* | 1/2015 | Endo | H05K 7/20745 361/679.49 |
| 2015/0030950 A1* | 1/2015 | Hood | H01M 8/04014 429/439 |
| 2015/0036293 A1* | 2/2015 | Martini | F24F 11/0001 361/695 |
| 2015/0116934 A1* | 4/2015 | Lazzari | F01D 15/10 361/692 |
| 2015/0250077 A1* | 9/2015 | Endo | H05K 7/20745 361/679.47 |
| 2015/0342087 A1* | 11/2015 | Donth | H05K 7/20918 361/695 |
| 2016/0037688 A1* | 2/2016 | Rodriguez | H05K 7/20836 361/679.48 |
| 2016/0106009 A1* | 4/2016 | Slessman | F28F 9/0265 361/679.47 |
| 2016/0135329 A1* | 5/2016 | Lewis, II | H05K 7/20745 361/692 |
| 2016/0183413 A1* | 6/2016 | Roesner | G06F 1/20 361/679.48 |
| 2016/0241112 A1* | 8/2016 | Shatek | H02K 7/1815 |
| 2017/0074542 A1* | 3/2017 | Leiterman | F24F 13/0236 |
| 2017/0296685 A1* | 10/2017 | Goodwin | A61L 2/007 |
| 2017/0358811 A1* | 12/2017 | Blackmore | H01M 8/0662 |
| 2018/0106326 A1* | 4/2018 | van't Schip | B29C 66/3494 |

* cited by examiner

RACK ENCLOSURE COOLING SYSTEMS AND RELATED METHODS

The disclosure herein relates to enclosure cooling systems, and in particular, relates to a rack enclosure cooling system providing substantially uniform cooling to an array of active devices, such as storage devices.

SUMMARY

In illustrative embodiments of the present disclosure, a system includes an enclosure having a front surface, a back surface, a supply plenum, an enclosure outlet adjacent to the back surface, and a device space extending between the front and back surfaces. The cooling system further includes an inlet partition including a plurality of apertures providing fluid communication and being positioned between the supply plenum and the device space. Additionally, the cooling system includes a layer of active devices in the device space defining a plurality of cooling channels aligned to the plurality of apertures, each cooling channel being in the layer adjacent to at least one of the active devices and configured to receive a cooling fluid. Further still, the cooling system includes a fan configured to draw the cooling fluid into the enclosure through an enclosure inlet adjacent to the front surface, the fan further configured to provide positive pressure within the enclosure to exhaust the cooling fluid out of the enclosure via the enclosure outlet.

In various illustrative embodiments of the present disclosure, a system includes an enclosure defining a supply plenum, an exhaust plenum, and a device space between the supply plenum and the exhaust plenum. The system further includes a layer of active devices arranged into an array having rows and columns in the device space defining a plurality of cooling channels in each row adjacent to the columns configured to receive a cooling fluid. The system additionally includes an inlet partition including a plurality of apertures, each aperture being aligned to provide the cooling fluid from the supply plenum to one of the cooling channels, the plurality of apertures being arranged into lines parallel to the columns of active devices, each line of apertures having more than one aperture aligned to at least one cooling channel. Furthermore, the system includes a fan configured to provide a positive pressure in the supply plenum relative to the exhaust plenum.

In further illustrative embodiments of the present disclosure, a method includes flowing a cooling fluid into a supply plenum adjacent to a device space having a plurality of active devices including data storage devices arranged into a series of rows. The method also includes transferring cooling fluid from the supply plenum to the device space through a plurality of apertures in an inlet partition separating the supply plenum and the device space. The method further includes removing cooling fluid from a plurality of cooling channels in each row adjacent to the active devices of the row to provide a thermal gradient profile of the cooling fluid in each row differing by less than 5 degrees C.

It is to be understood that both the foregoing general description and the following detailed description present embodiments of the subject matter of the present disclosure, and are intended to provide an overview or framework for understanding the nature and character of the subject matter of the present disclosure as it is claimed.

BRIEF DESCRIPTION OF THE DRAWINGS

The accompanying drawings are included to provide a further understanding of the subject matter of the present disclosure, and are incorporated into and constitute a part of this specification. The drawings illustrate various embodiments of the subject matter of the present disclosure and together with the description serve to explain the principles and operations of the subject matter of the present disclosure. Additionally, the drawings and descriptions are meant to be merely illustrative, and are not intended to limit the scope of the claims in any manner.

The disclosure may be more completely understood in consideration of the following detailed description of various embodiments of the disclosure in connection with the accompanying drawings.

DETAILED DESCRIPTION

In the following detailed description, reference is made to several specific embodiments. It is to be understood that other embodiments are contemplated and may be made without departing from the scope or spirit of the present disclosure. The following detailed description, therefore, is not to be taken in a limiting sense.

Many data rooms have cold aisles and hot aisles for cooling racked data storage systems. A data storage rack typically draws air from a cold aisle and exhausts warmer air into a hot aisle. A cooling unit may be associated with a rack or a group of racks (e.g., a small group) for recirculating cooled air through the enclosures of the rack or racks. A cooling unit may be disposed within a rack or may be external to a rack (e.g., beside the rack).

Some data storage racks may include multiple racked enclosures. Each enclosure may include a plurality of storage devices, which are cooled by air drawn from the cold aisle by one or more fans. Typically, the one or more fans are within in the rack, and may be within the enclosures or mounted on a rear door of the rack. The fans may transfer air in a direction from the cold aisle, past storage devices, and to hot aisle.

To provide increased storage density in each enclosure, or per rack unit, multiple storage devices are often arranged into rows from front to back within an enclosure with limited space between the storage devices. Fans may transfer air through the limited spaces at a sufficient velocity and temperature in order to provide sufficient cooling of each storage device. Further, some enclosure designs cool storage devices from front-to-back, or from cold aisle to hot aisle, which can facilitate airflow velocity but generate pre-heat.

Pre-heat describes the temperature increase of cold air moving from row-to-row, which cools storage devices but heats the cold air. As a result, later rows may receive "warmer" cold air than earlier rows. For example, the cold air temperature may rise about 10 degrees Celsius (° C.) across each row, so if an enclosure has 5 rows of storage devices, the last row of storage devices would receive cold air warmed by the previous 4 rows at about 40° C. higher than the first row.

Pre-heat may limit the design of a storage system, for example, related to arrangement of storage devices, the number of storage devices requiring a high thermal margin, the amount of cooling required for each enclosure, and the mean time-between-failure (MTBF). In some cases, the cold air temperature required to cool certain storage devices in a last row may not be available. For example, some data centers utilize ambient air from an outside environment without significant additional cooling. On the other hand, where sufficient cold air is available, pre-heat may reduce the cooling efficiency of a storage system. One or more rows may be over-cooled in order to sufficiently cool the last row. Furthermore, design flexibility may be limited by some types of storage devices requiring a high thermal margin or low operating temperature, which would limit placement to an "earlier" row in the enclosure.

It would be beneficial to provide a cooling solution that expands design flexibility in the storage system, particularly high density storage systems. It would also be beneficial to provide storage systems with improved MTBF. Further, it would be beneficial to provide a cooling solution that more efficiently cools storage devices within an enclosure.

The present disclosure describes a cooling system for rack enclosures that provides substantially uniform cooling to (e.g., substantially uniform heat transfer from) each of the active devices within an enclosure, which may facilitate design flexibility, reliability (e.g., MTBF), and efficiency over conventional cooling systems (e.g., less over-cooling). The cooling system may also be compatible with cooling arrangements in a wide range of data rooms having cold aisles and hot aisles.

In some illustrative embodiments, the enclosure includes a device space having a layer of active devices arranged into rows and adjacent cooling channels and an inlet partition having apertures aligned to the cooling channels defining a supply plenum. Cooling fluid is transferred from the supply plenum to the cooling channels, which concurrently cools the layer of active devices and may provide substantially the same temperature and flow of cooling fluid to each row of active devices. Preferably, each active device in the layer receives substantially the same temperature and flow of cooling fluid. A cooling fluid may be any suitable fluid for transferring heat away from a component. Non-limiting examples of cooling fluid include air (e.g., ambient or cooled air) or a liquid coolant.

In many embodiments, the active devices may include storage devices. The supply plenum may include elongate ducts to encourage uniform cooling along a row. The supply plenum may also include a duct partition or more than one supply plenum to encourage uniform cooling among the rows. Additionally, or alternatively, one or more fans may be included to provide pressurized cooling fluid in the supply plenum or to further encourage uniform cooling throughout the device space.

Reference will now be made to the drawings, which depict one or more aspects described in this disclosure. However, it will be understood that other aspects not depicted in the drawings fall within the scope and spirit of this disclosure. Like numbers used in the figures refer to like components, steps and the like. However, it will be understood that the use of a reference character to refer to an element in a given figure is not intended to limit the element in another figure labeled with the same reference character. In addition, the use of different reference characters to refer to elements in different figures is not intended to indicate that the differently referenced elements cannot be the same or similar.

Figure 1:
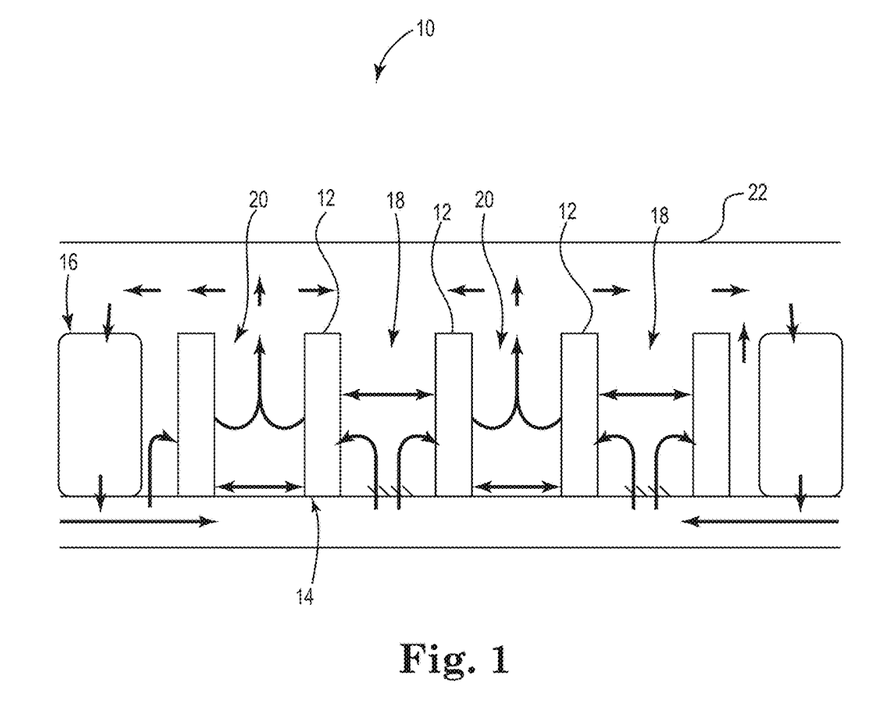
FIG. 1 is a schematic illustration of a data room with racks.

FIG. 1 shows a data room 10 that may be compatible with various illustrative cooling systems according to the present disclosure. The data room 10 maintains a plurality of racks 12 on a raised tile floor 14. Each rack 12 may include active devices associated with the storage and/or processing of data, such as storage devices, servers, computing units, controllers, or network cards. Examples of storage devices include hard drives, flash drives, solid state drives, or any other suitable device capable of storing information or data for later use or retrieval. The active devices in the racks 12 may be cooled by a cooling fluid, such as air flowing through the data room 10.

As illustrated, cooled air may be provided or supplied by a room cooling unit 16 and transferred into a space (e.g., plenum) below the raised tile floor 14. Cold air may be forced through vents and transferred to one or more cold aisles 18 positioned adjacent to the racks 12. For example, the cold aisle 18 may be positioned adjacent to a front surface or side of a rack 12, which draws cold air from the cold aisle 18 to cool active devices within the rack 12.

Active devices may have a desired operating temperature range. The cold air provided to the rack 12 may be about equal to a desired operating temperature within the range, or be within a sub-range of the desired operating temperature range, to cool the active devices. For example, a desired operating temperature range may be about 10° C. to about 60° C., and the cold air temperature may be from about 18° C. to about 23° C. In the process of cooling the active devices within the rack 12, the cold air may be heated to become warmer or hotter. The heated air may then be exhausted or expelled from the rack 12 into hot aisle 20. The heated air rises toward ceiling 22 of the data room 10 and may be encouraged to flow toward a room cooling unit 16, for example, due to one or more fans in the room cooling unit 16. The heated air may be recirculated as cold air once again and supplied to the space in the raised tile floor 14.

In some illustrative embodiments, a data room 10 may not include a room cooling unit 16. Also, cold air may not be recirculated. For example, the data room 10 may supply fresh cold air from the ambient environment outside of the data room 10 (e.g., outdoors). The fresh cold air may be, or may not be, cooled before being used to cool the active devices in the rack 12. In some embodiments, the cold air provided to the rack 12 may be the same or similar to the external ambient temperature.

In many embodiments, individual enclosures in the rack will draw air from the cold aisle 18 to cool active devices and exhaust hot air 20 into the hot aisle. In various embodiments, individual enclosures will cool and recirculate air within the enclosure and may not need a supply of cool air from the cold aisle 18.

Figure 2:
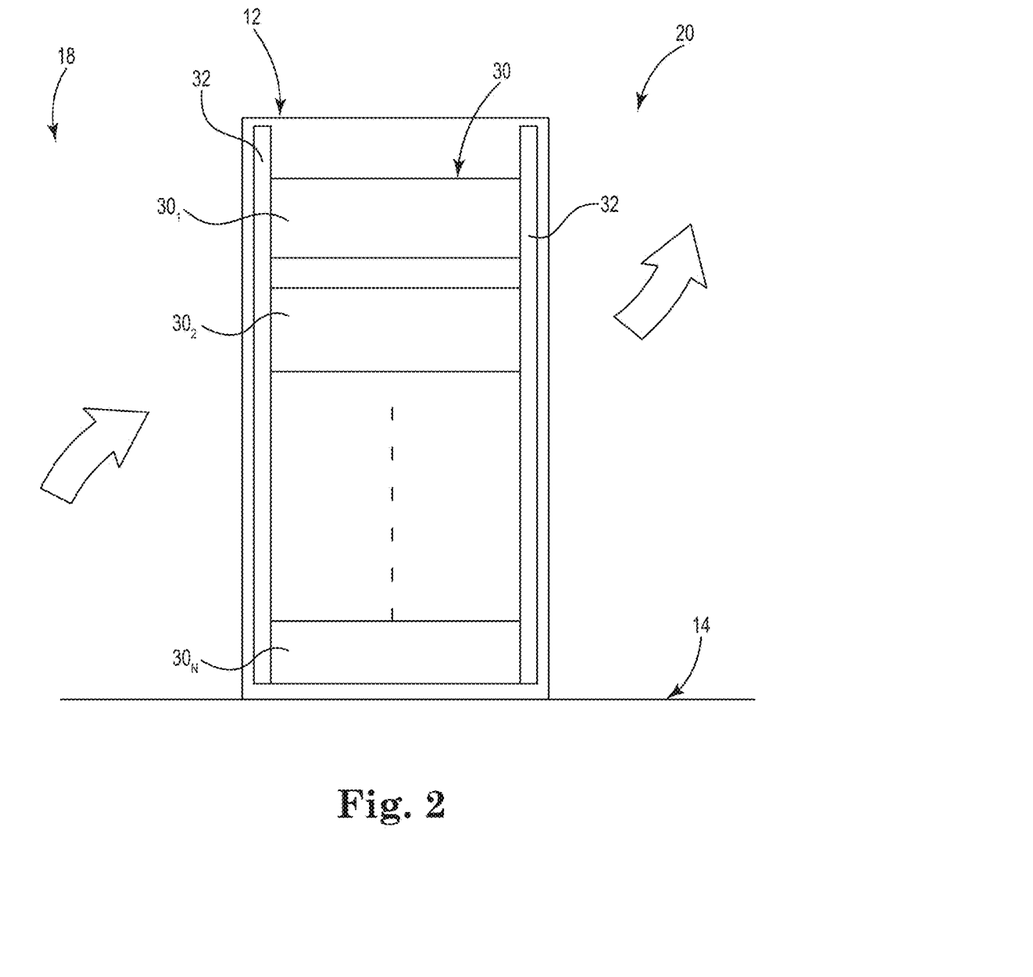
FIG. 2 is a schematic illustration of a rack of FIG. 1 with enclosures.

FIG. 2 shows a rack 12 that may include one or more enclosures 30. As shown, the rack 12 includes a plurality of enclosures 30 having n number of enclosures $30_1$, $30_2$, ... $30_n$. As shown, the plurality of enclosures 30 may be arranged linearly and in a stacking arrangement. The stack may extend, for example, in the vertical direction or in the direction of the height of the rack 12.

The rack 12 may or may not define a space between enclosures 30. In many illustrative embodiments, a rack 12 may be full of enclosures 30 and leave no spaces between enclosures 30. In various embodiments, a rack 12 may have spaces between enclosures 30 that are at least partially blocked by a blanking plate to encourage airflow through the inside of the enclosures 30 rather than flowing past the enclosures 30.

Each enclosure may include one or more active devices to be cooled. An enclosure 30 may include a front surface or front side adjacent to the front side of the rack 12 and the cold aisle 18. An enclosure 30 may also include a back surface or back side adjacent to the back side of the rack 12 and the hot aisle 20. However, the enclosure 30 may be oriented in any direction relative to the aisles 18, 20. For example, the enclosure 30 may include a recirculating cooling unit or may have an inlet and outlet positioned adjacent other surfaces of the enclosure 30.

The rack 12 may include one or more rack rails 32 for mounting the enclosures 30. The rack rails 32 may extending away from the raised floor 14, for example, parallel to the height of the rack 12 and orthogonal to the plane of the raised floor 14. The enclosures 30 may be mounted orthogonal to the rack rail 32 or parallel to the raised floor 14. The stack, formed of a plurality of enclosures 30, may extend parallel to the rack rail 32.

Figure 3A:
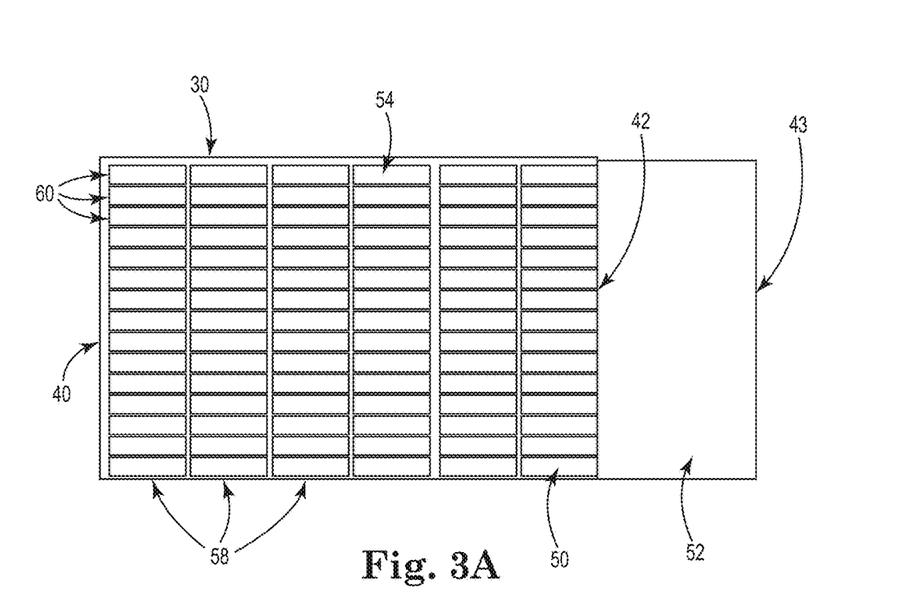
FIGS. 3A and 3B are schematic illustrations in plan view and elevation view, respectively, of an enclosure.
Figure 3B:
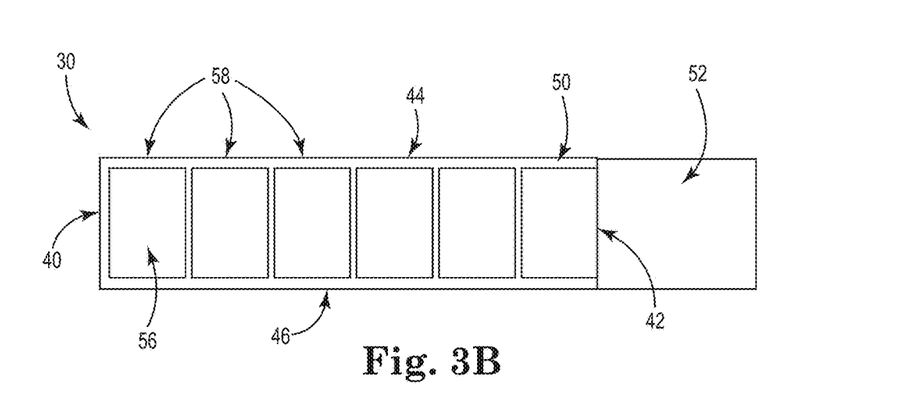

FIGS. 3A and 3B show more detail of an enclosure 30, which may benefit from a cooling system of the present disclosure. As illustrated, enclosure 30 defines a device space 50. The device space 50 may be defined by a front surface 40, a back surface 42, a top surface 44, and a bottom surface 46 of the enclosure 30. For example, a device space 50 may extend between the front and back surfaces 40, 42. The device space 50 may also extend at least partially between, or be disposed between, the top and bottom surfaces 44, 46.

The enclosure 30 may also define a second back surface 43 spaced apart from the device space 50. The second back surface 43 may be disposed adjacent to a rear of a rack 12 (FIG. 2). A control space 52 may be disposed between the back surfaces 42, 43. In various embodiments, the control space 42 is adjacent to the device space 50. In some embodiments, the control space 52 may be adjacent the back surface 42 of the enclosure 30.

The device space 50 may include active devices 54 (e.g., storage devices). Each active device 54 may include an exterior surface 56. In some illustrative embodiments, the exterior surface 56 of an active device 54 is a major surface that provides the most surface area for cooling, or more surface area, than other surfaces of the active device 54.

The active devices 54 may be arranged into a layer. For example, the layer of active devices 54 may be arranged into an array having rows 58 and columns 60. In many illustrative embodiments, the rows and columns 58, 60 extend orthogonal to each other. The rows 58 may be arranged between the front surface 40 and the back surface 42 of the enclosure 30. Each column 60 may extend between the front surface 40 and the back surface 42. Each row 58 may include a plurality of active devices 54. Each column 60 may include a plurality of active devices 54. In some embodiments, an enclosure 30 may include more than one layer of active devices 54.

The control space 52 may include various devices, such as a controller, a cooling unit, a power supply, and a fan. In some embodiments, the control space 52 may not include the same devices as the active devices 54 in the device space 50. In various embodiments, the control space 52 may also be considered part of the device space 50, and devices in the control space 52 may be cooled in a similar manner to the active devices 54 in the device space 50.

Figure 4:
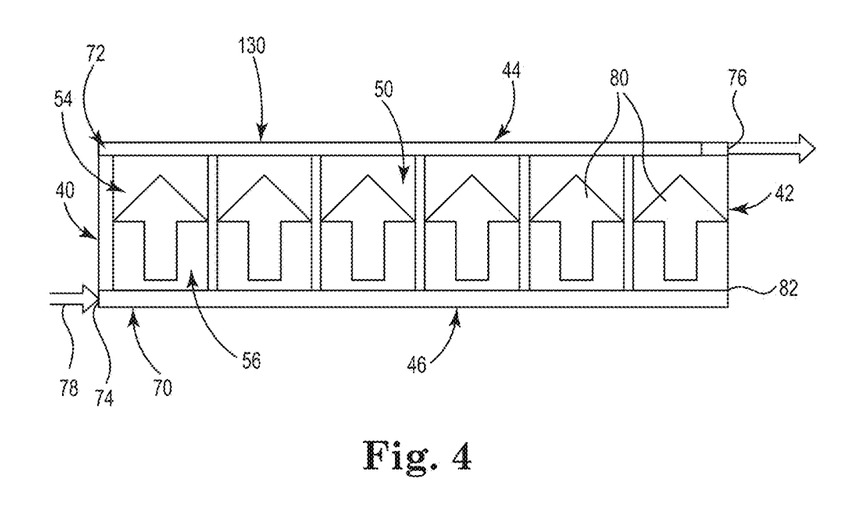
FIG. 4 is a schematic illustration in elevation view of an enclosure with a pass-through cooling system.

FIG. 4 shows an enclosure 130 with a pass-through cooling system. The enclosure 130 may be similar to the enclosure 30, and the same or similar elements are numbered accordingly. As illustrated, an enclosure, such as enclosure 130, may include a device space 50 extending between the supply plenum 70 and the exhaust plenum 72. The supply plenum 70 may be adjacent the bottom surface 46. The exhaust plenum 72 may adjacent the top surface 44. A layer of active devices 54 may be disposed in the device space 50 defining a plurality of cooling channels 80. In various embodiments (not shown), an enclosure may include more than one device space 50 having a layer of active devices 54, each separated by a supply plenum 70 and/or an exhaust plenum 72.

A cooling channel 80 may be disposed in the layer of active devices 54 adjacent to at least one active device 54. Cooling channels 80 may be disposed adjacent to the columns of active devices 54. For example, a cooling channel 80 may be a space or gap between active devices 54, or a cooling channel 80 may be a space or gap between an active device 54 and a surface of the enclosure 130 (e.g., a side surface extending between the front and back surfaces 40, 42). In some illustrative embodiments, each row of active devices 54 may include a plurality of cooling channels 80.

In some illustrative embodiments, the plenums 70, 72 may define spaces or volumes for receiving and transferring cooling fluid 78. As shown, the plenums 70, 72 each extend between the front and back surfaces 40, 42 of the enclosure 130. The plenums 70, 72 may be generally planar, for example, in the shape of a rectangular prism.

The volume of the device space 54 may define an area (e.g., depth and width) including the active devices 54 arranged into an array having rows and columns and the cooling channels 80. In particular, the area defined by the device space 54 may extend from the front surface to the back surface and between the side walls of the enclosure (not shown). The supply plenum 70 may supply cooling fluid to the entire device space 54. For example, the supply plenum 70 may extend across the entire area of the device space 54. The exhaust plenum 72 may also extend across the entire area of the device space 54. In various illustrative embodiments, the height of the enclosure 130 defines the height of the supply plenum 70, device space 54, and the exhaust plenum 72.

The enclosure 130 may also define an inlet 74 and an outlet 76. A cooling fluid 78 may enter the enclosure 130 at the inlet 74 and exit, or leave, the enclosure 130 at the outlet 76. After passing through inlet 74, cooling fluid 78 may enter into the supply plenum 70 and be distributed throughout the volume of the supply plenum 70. The cooling fluid 78 may be pressurized, for example, by a fan before entering the supply plenum 70 or within the supply plenum 70. The cooling fluid 78 may enter into the supply plenum 70 through one or more apertures through a surface forming a boundary of the supply plenum 70. For example, the cooling fluid 78 may enter into the supply plenum 70 at one surface or at one end. As shown, the cooling fluid 78 may enter into the supply plenum 70 adjacent to the front surface 40 of the enclosure 130.

The supply plenum 70 may be separated from the device space 50 by an inlet partition 82. The inlet partition 82 may allow fluid communication between the supply plenum 70 and the device space 50. For example, the inlet partition 82 may include one or more apertures extending through the inlet partition 82 that allow cooling fluid 78 in the supply plenum 70 to flow into cooling channels 80 in the device space 50.

A cooling channel 80 may receive the cooling fluid 78. As illustrated, arrows represent a direction of the flow of cooling fluid 78 through the device space 50. The cooling fluid 78 may be heated in the cooling channel 80, for example, by the active devices 54. A cooling channel 80 may also allow the cooling fluid 78 to transfer to the exhaust plenum 72, for example, after passing the layer of active devices 54.

The cooling fluid 78 may exit the exhaust plenum 72 through one or more apertures through a surface forming a boundary of the exhaust plenum 72. For example, the cooling fluid 78 may exit the exhaust plenum 72 at one surface or at one end. As shown, the cooling fluid 78 may exit the exhaust plenum 72 adjacent the back surface 42 or the enclosure 130. The cooling fluid 78 may exit the enclosure 130 through the outlet 76.

The enclosure 130 may allow for cooling fluid 78 to flow through the cooling channels 80 from the supply plenum 70 to the exhaust plenum 72. In various embodiments, the enclosure 130 may be configured to flow cooling fluid 78 through a cooling channel 80 in a cooling channel direction orthogonal to a rearward direction from the front surface 40 to the back surface 42. When the enclosure 130 is mounted into a rack, the cooling fluid direction may be parallel to a rack rail (e.g., rail 32).

A cooling channel 80 may be adjacent at least one exterior surface 56 of an active device 54, which may be a major surface. The exterior surface 56 may preferably extend, at least partially, between the top and bottom surfaces 44, 46 of the enclosure 130 to facilitate a cooling fluid direction through the cooling channel 80 and between the plenums 70, 72. In some embodiments, the exterior surface 56 may extend, at least partially, between the front and back surfaces 40, 42 of the enclosure 130. However, the active devices 54 may also be oriented so that the exterior surface 56 extends, at least partially, between side surfaces of the enclosure 130 (not shown).

In some illustrative embodiments, a fan may be positioned adjacent to the enclosure 130 to draw cooling fluid 78 into the enclosure 130 through the inlet 74. The fan may also provide a positive pressure within the enclosure 130 to exhaust the cooling fluid 78 out of the enclosure 130 via the outlet 74. In particular, the fan may provide a positive pressure in the supply plenum 70 relative to the exhaust plenum 72.

As used herein, a fan is a fluid moving device, which may be able to move a gas and/or a liquid. In many embodiments, fans can generate a pressure differential from a fan inlet to a fan outlet for the purpose of transferring cooling fluid across the cooling channels 80. Non-limiting examples of fans include one or more of a blower fan, an axial fan, and a pump.

By providing an even flow of cooling fluid to each cooling channel, the thermal gradient profile for the cooling channels may differ by less than a target temperature change from adjacent cooling channels during normal operation. Non-limiting examples of a target temperature change between adjacent rows or columns may be less than 10 degrees Celsius (° C.), less than 5° C., less than 2° C., or less than 1° C. In various embodiments, the thermal gradient profile of cooling fluid in a row of active devices may differ by less than 5° C. from an adjacent row of active devices.

Figure 5:
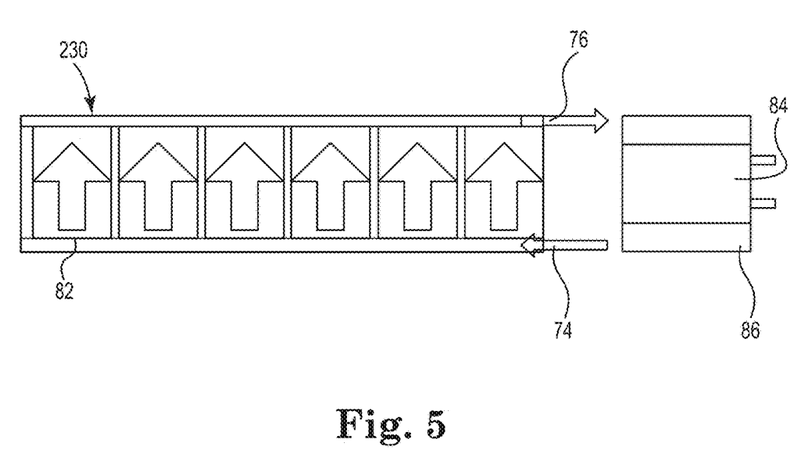
FIG. 5 is a schematic illustration in elevation view of an enclosure with a recirculating cooling system.

FIG. 5 shows an enclosure 230 with a recirculating cooling system. The enclosure 230 may be similar to the other enclosures 30, 130, and the same or similar elements are numbered accordingly or not marked with reference characters. However, as shown, the enclosure 230 may include an inlet 74 and an outlet 76 on the same surface (e.g., back surface) of the enclosure 230.

The inlet 74 and outlet 76 may be in fluid communication with a cooling unit 84. A cooling unit 84 may recondition cooling fluid for recirculation in the enclosure 230. A cooling unit 84 may be disposed adjacent to the enclosure 230 to provide cooling fluid to inlet 74 and to receive heated cooling fluid from outlet 76. In many embodiments, the heat may be transferred away from the cooling unit 84 by a separate circuit of cooling fluid, which may use the same or different type of cooling fluid than is used for cooling the device space (e.g., water). A blower fan 86 may be positioned adjacent the cooling unit 84 to provide a pressure differential and, thus, a flow of cooling fluid through the enclosure 230. The heated air from the enclosure 230 may flow into a plenum before entering the cooling unit 84, and the blower fan 86 may be positioned downstream. In other embodiments (not shown), the blower fan 86 may be positioned upstream and/or a plenums may be positioned downstream of the cooling unit 84.

Although the inlet 74 and outlet 76 are shown disposed adjacent a back surface of the enclosure 230, the inlet 74 and outlet 76 may be disposed adjacent to any surface of the enclosure 230, whether the same or different, that maintains fluid communication with the cooling unit 84 for providing cooling fluid to the inlet 74 and receiving heated cooling fluid from the outlet 76.

Similar to enclosure 130, an inlet partition 82 forms a boundary of the supply plenum. However, the inlet partition 82 may be designed differently to adjust for pressurized cooling fluid flowing into the enclosure near a back surface instead of near a front surface.

Figure 6:
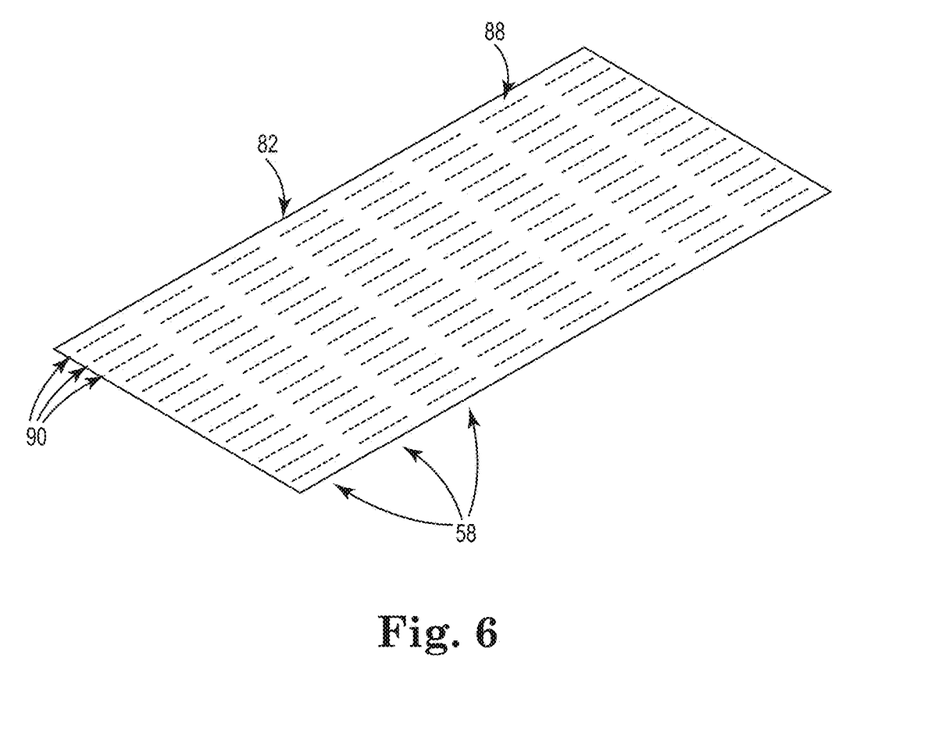
FIG. 6 is a perspective view of an inlet partition for the enclosure of FIG. 4.

FIG. 6 shows an inlet partition 82 for an enclosure, such as the enclosures 30, 130, 230. The inlet partition 82 may include a plurality of apertures 88 extending through the inlet partition 82. The plurality of apertures 88 may be positioned between a supply plenum and a device space in an enclosure. The plurality of apertures 88 may also provide fluid communication between the supply plenum and the device space in the enclosure.

The inlet partition 82 may substantially planar in shape. For example, the inlet partition 82 may be in the shape of a rectangle. In some illustrative embodiments, active devices are coupled to the inlet partition 82 formed from a printed circuit board (PCB) also serving as a baseplane. The inlet partition 82, or baseplane, may be electrically coupled to one or more of the active devices, which may serve to operably connect the active devices to other components outside of the enclosure. For example, the baseplane may be operably connected to components in a control space adjacent the device space or components outside of the rack.

An aperture 88 may have a generally narrow width to direct cooling fluid into an aligned cooling channel. In some embodiments, the width of an aperture 88 is less than or equal to the width of the aligned cooling channel.

The plurality of apertures 88 may be arranged into lines 90. In some embodiments, lines 90 may be arranged parallel to the columns of active devices.

A line 90 may extend across one or more rows 58 of active devices. Each line 90 may include the same number of apertures 88 as the other lines. In other embodiments (not shown), the lines 90 may have different numbers of apertures 88.

One or more apertures 88 may be aligned to each cooling channel. In some embodiments, each line 90 may have more than one aperture 88 aligned to at least one of the cooling channels associated with the line 90. In various embodiments, each row 58 may include the same number of apertures 88 aligned to each of the cooling channels.

In other embodiments, each row 58 may not include the same number of apertures 88. In some cases, a pressure gradient in the supply plenum may develop as cooling fluid flows through a supply plenum and out of the apertures 88 from the fan side, which may also be the inlet side. For example, the supply plenum may develop a higher pressure near the front of the enclosure (near the fan) than near the back of the enclosure (away from the fan) as cooling fluid leaves the supply plenum through the apertures 88. To facilitate an even flow of cooling fluid to each of the cooling channels, an enclosure and the inlet partition 82 may use one or more techniques related to the inlet partition 82.

One example of a technique includes apertures 88 that increase in size in a direction away from an inlet of the enclosure along a line 90 (e.g., a rearward direction). For example, apertures in a line 90 may have widths or cross-sectional areas that increase in size in the rearward direction.

Another example includes apertures 88 that increase in number in a direction away from the inlet of the enclosure along a line 90 (e.g., rearward direction). For example, the number of apertures 88 aligned to each channel (e.g., per channel) may increase in the rearward direction.

A further example includes the supply plenum having a shape that increases pressure in a direction away from the inlet of the enclosure along a line 90 (e.g., rearward direction). For example, the inlet partition 82 may be aligned relative to a bottom surface of the enclosure to define a taper, which decreases the height of the supply plenum, in the rearward direction. The taper may be linear or non-linear (e.g., curved). The inlet partition, the bottom surface, or neither may be parallel to the array of active devices and/or the top surface of the enclosure. In some embodiments without a taper, the inlet partition and the bottom surface may be parallel to the array of active devices and/or the top surface of the enclosure.

Figure 7:
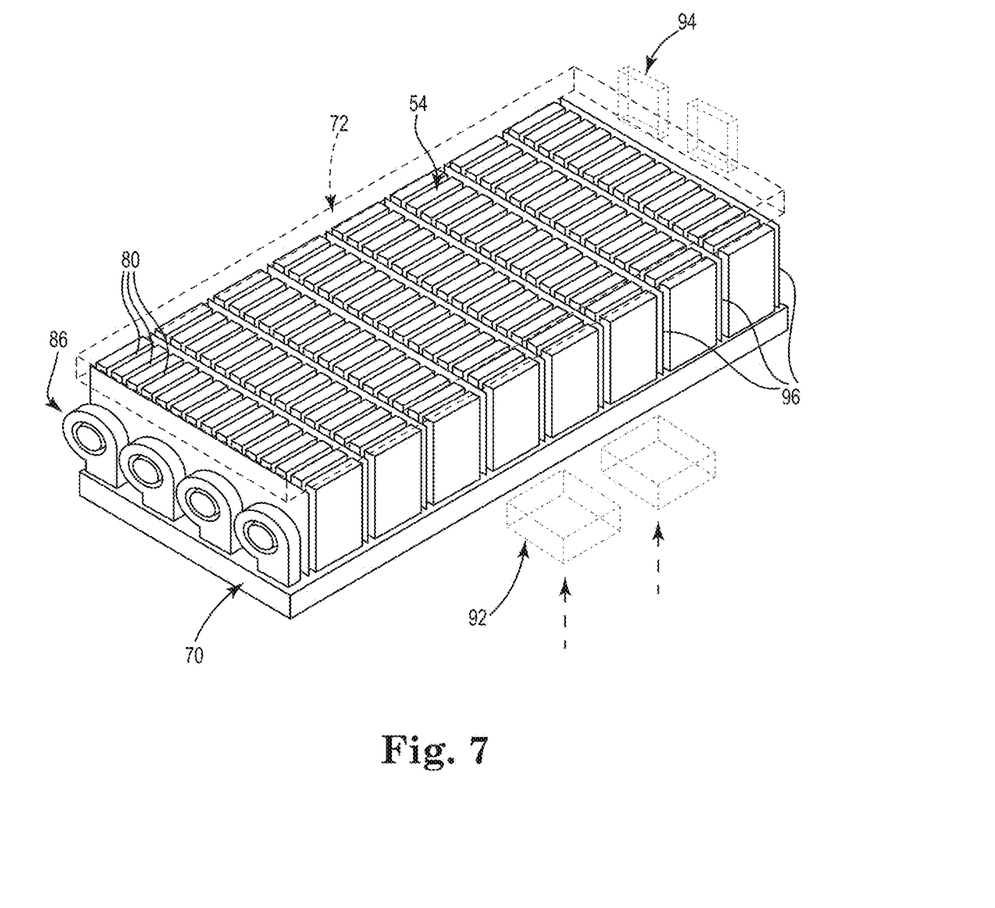
FIG. 7 is a perspective view of components for the enclosure of FIG. 4.

FIG. 7 shows various components that may be disposed inside an enclosure, such as the enclosures 30, 130, 230, and various fans 86, 92, 94 that may be used for moving cooling fluid through the cooling channels 80 between active devices 54.

For example, a fan may provide a higher pressure toward the inlet of an enclosure than an outlet of an enclosure to encourage air to flow from the inlet to the outlet.

In various illustrative embodiments, one or more blower fans 86 may be positioned adjacent to or near a front of an enclosure. In particular, a blower fan 86 may be disposed in or adjacent to an enclosure inlet (e.g., inlet 74). As shown, a blower fan 86 may direct air downward into the supply plenum 70. Alternatively, a blower fan 86 may direct air laterally and in-line with the supply plenum 70 (e.g., rearward).

One or more axial fans 92 may be disposed in or adjacent to a bottom surface of the enclosure. As shown, an axial fan 92 may also direct pressurized cooling fluid into the supply plenum 70 as an alternative or in addition to the blower fans 86.

The inlet of a blower fan 86 or an axial fan 92 may receive cooling fluid from one or more inlets of the enclosure (e.g., inlet 74, shown in other figures). An outlet of a blower fan 86 or an axial fan 92 may direct pressurized cooling fluid into a supply plenum 70 of the enclosure.

One or more secondary fans 94 may be positioned adjacent to or near a back of an enclosure. In particular, a secondary fan 94 may be disposed in or adjacent to an enclosure outlet (e.g., outlet 76). A secondary fan 94 may draw cooling fluid through the enclosure outlet from, for example, the device space and the exhaust plenum 72. In particular, a secondary fan 94 may reduce or eliminate the pressure build-up in the device space or the exhaust plenum to facilitate the proper flow of cooling fluid through the plurality of cooling channels.

One or more row partitions 96 may be disposed in the device space and positioned between rows of active devices. A row partition 96 may also separate, or form a boundary between, adjacent rows to organize the flow of cooling fluid through the layer of active devices to facilitate an even flow to each row of cooling channels 80. In particular, a row partition 96 may separate one cooling channel and an adjacent cooling channel.

A row partition 96 may be formed of solid plate free of apertures or may be substantially solid enough to prevent or reduce the flow of cooling fluid intended for one row or cooling channel from flowing into a different row or cooling channel. In some embodiments, the cooling fluid may flow through only one cooling channel 80 before reaching the exhaust plenum 72. However, in other embodiments (not shown), not every cooling channel 80 is separated by a row partition 96.

Figure 8:
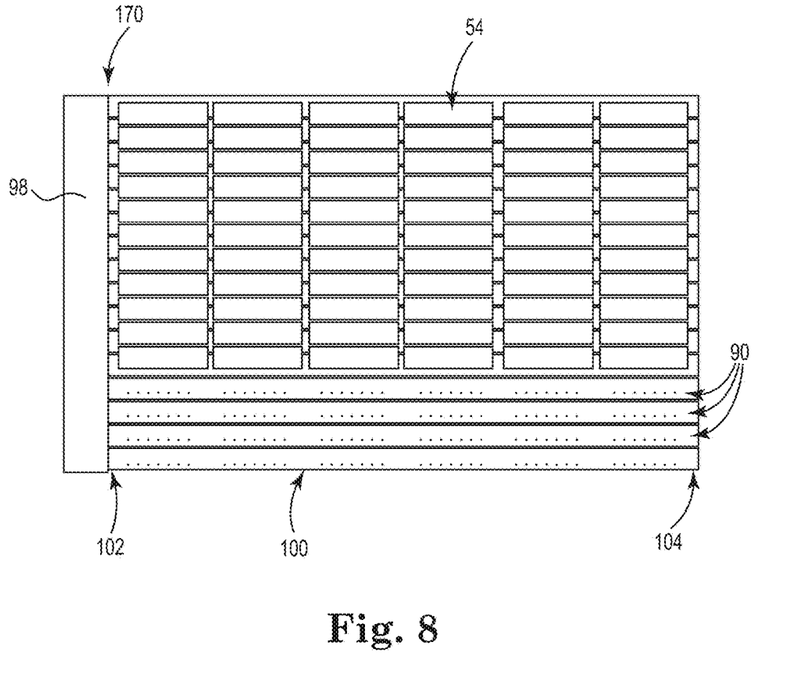
FIG. 8 is a schematic illustration in plan view of a supply plenum with a primary plenum and elongate ducts.

FIG. 8 shows a supply plenum 170 divided into, or including, a primary plenum 98 and elongate ducts 100 for an enclosure. For illustrative purposes, some of the active devices 54 are removed in this view to better show the elongate ducts 100. In some embodiments, all of the elongate ducts 100 may be associated with cooling channels of the active devices 54. The supply plenum 170 may be similar to supply plenum 70 and be used and positioned in a similar manner. Pressurized cooling fluid may be provided in the primary plenum 98 (e.g., by fans). The pressurized cooling fluid may flow into, or be distributed among, the elongate ducts 100. In some embodiments, the cooling fluid may be distributed evenly among the elongate ducts 100.

Elongate ducts 100 may organize the flow of cooling fluid to facilitate an even flow to each line of apertures 90. For example, one elongate duct 100 may be aligned to provide cooling fluid to one line of apertures 90 and, thus, aligned to provide cooling fluid to a specific set of cooling channels (e.g., a series of cooling channels 80). As illustrated, active devices 54 may define cooling channels aligned to the elongate ducts 100. However, in other embodiments (not shown), the elongate duct 100 may not be limited to only one line 90.

An elongate duct 100 may have a first end 102 and a second end 104 opposite the first end. As shown, a first end 102 of an elongate duct 100 may be adjacent to a primary plenum 98 at a front of an enclosure, and the elongate duct 100 may extend to a second end 104 toward a back of the enclosure. Also, as shown, the elongate duct 100 may extend parallel to a line of apertures 90. The elongate duct 100 may also extend the length of the line of apertures 90 to supply the entire line 90 with cooling fluid. However, in other embodiments (not shown), the elongate duct 100 may not supply an entire line 90 with cooling fluid.

Figure 9:
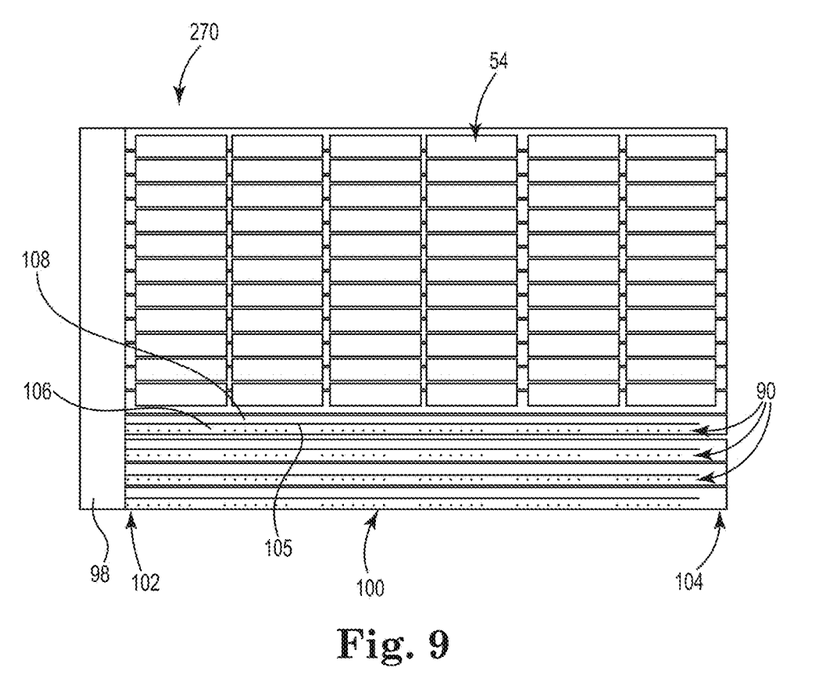
FIG. 9 is a schematic illustration in plan view of a supply plenum with elongate ducts having duct partitions.

FIG. 9 shows a supply plenum 270, which may be similar to supply plenum 170 but includes duct partitions 105. For illustrative purposes, some of the active devices 54 are removed in this view to better show the elongate ducts 100. In some embodiments, all of the elongate ducts 100 may be associated with cooling channels of the active devices 54. A duct partition 105 may organize the flow of cooling fluid to facilitate an even flow to a line of apertures 90, which may facilitate even cooling of the active devices 54. In particular, the duct partition 105 may facilitate an even pressure drop across a line of apertures 90.

A duct partition 105 may divide an end of an elongate duct 100 into a first duct space 106 and a second duct space 108. For example, a first end 102 adjacent to the primary plenum 98 may be divided into the first and second duct spaces 106, 108. The duct partition 105 may extend toward a second end 104 of the elongate duct 100 opposite the first end. However, the duct partition 105 may not extend entirely to the second end. The duct partition 105 may terminate short of the second end to form an end space at the second end, which is free of the duct partition 105.

An elongate duct 100 having a duct partition 105 may receive pressurized cooling fluid from the primary plenum 98 in both the first and second duct spaces 106, 108. The first duct space 106 may be adjacent to, or aligned with, a line of apertures 90. However, the second duct space 108 may not be adjacent to a line of apertures 90. The second duct space 108 may be separated from the line of apertures 90 by the duct partition 108 and the first duct space 106. Cooling fluid entering the second space 108 may travel toward the second end of the elongate duct 100, through the end space, and into the first duct space 106 before reaching the line of apertures 90. The presence of the duct partition 105 may facilitate more balanced pressure of cooling fluid along the line of apertures 90 that may otherwise have a higher pressure near the first end than at the second end of the elongate duct 100.

Figure 10:
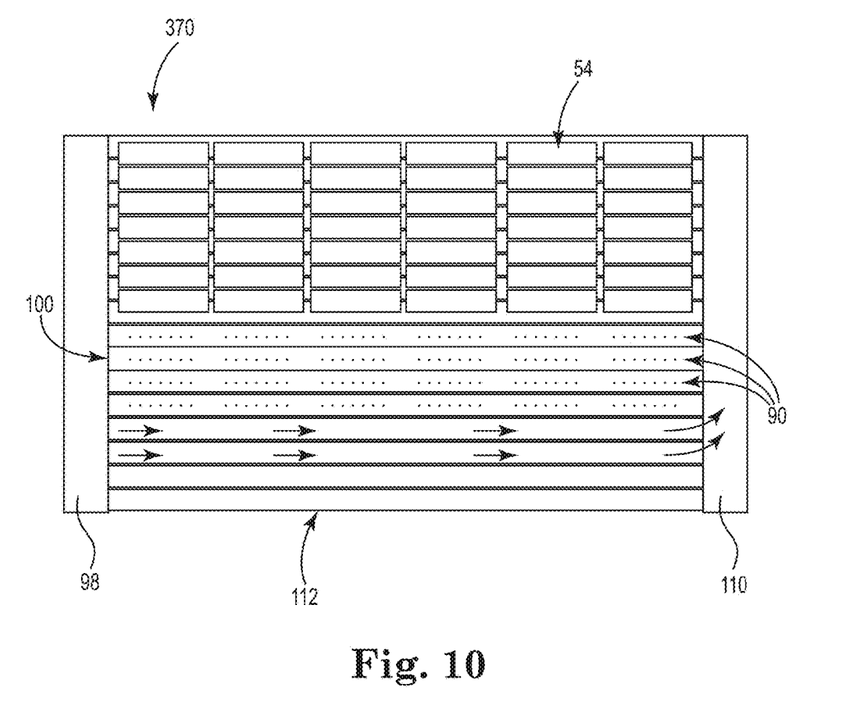
FIG. 10 is a schematic illustration in plan view of a supply plenum with elongate ducts and a secondary plenum.

FIG. 10 shows a supply plenum 370, which may be similar to supply plenum 170 but includes a secondary plenum 110 and dedicated supply ducts 112. For illustrative purposes, some of the active devices 54 are removed in this view to better show the elongate ducts 100. In some embodiments, all of the elongate ducts 100 may be associated with cooling channels of the active devices 54. A secondary plenum 110 may be fluidly coupled to the elongate ducts 100 at an end opposite the primary plenum 98 (e.g., adjacent a second end of the elongate ducts 100). The dedicated supply ducts 112 may be similar to the elongate ducts 100 but not be adjacent to, or aligned to, any apertures 90.

Cooling fluid may flow from the primary plenum 98 to an elongate duct 100 and a dedicated supply duct 112. A line of apertures 90 aligned to the elongate duct 100 may be supplied by cooling fluid from the primary plenum 98. The line of apertures 90 may also be supplied by cooling fluid from the secondary plenum 110. The cooling fluid in the secondary plenum 110 may be supplied from the primary plenum 98 through the dedicated supply duct 112. In some embodiments, active devices 54 may not be associated the dedicated supply ducts 112 due to the lack of apertures 90 to transfer cooling liquid from the supply plenum 370.

With the various enclosures with cooling systems being described, a plurality of active devices in an enclosure may be cooled by the flow of a cooling fluid into a supply plenum adjacent to a device space having a plurality of active devices having data storage devices arranged into a series of rows. Cooling fluid may then be transferred from the supply plenum to the device space through a plurality of apertures in an inlet partition separating the supply plenum and the device space. Further, cooling fluid may be removed from a plurality of cooling channels in each row adjacent to the active devices of the row to provide a thermal gradient profile of the cooling fluid in each row differing by less than 5 degrees C.

The flow of cooling fluid to each row may be divided equally among the plurality of cooling channels in the row. Each cooling channel in the row may be aligned to an equal number of the plurality of apertures in the inlet partition. The cooling fluid may also be divided into a plurality of elongate ducts in the supply plenum. Each elongate duct may be aligned to one of the lines of apertures.

Thus, embodiments of the RACK ENCLOSURE COOLING SYSTEMS AND RELATED METHODS are disclosed. Although reference is made to the accompanying set of drawings that form a part hereof and in which are shown by way of illustration several specific embodiments, it is to be understood that other embodiments are contemplated and may be made without departing from (e.g., still falling within) the scope or spirit of the present disclosure. The detailed description, therefore, is not to be taken in a limiting sense.

All references and publications cited herein are expressly incorporated herein by reference in their entirety into this disclosure, except to the extent they may directly contradict this disclosure.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "up to" or "no greater than" a number (e.g., up to 50) includes the number (e.g., 50), and the term "no less than" a number (e.g., no less than 5) includes the number (e.g., 5).

Unless otherwise noted, all parts, percentages, ratios, etc. are by weight. These abbreviations are used herein: wt=weight, ° C.=degrees Celsius, and ppm=parts per million.

The terms "coupled" or "connected" refer to elements being attached to each other either directly (in direct contact with each other) or indirectly (having one or more elements between and attaching the two elements).

Terms related to orientation, such as "top", "bottom", "side", and "end", are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

The term "and/or" means one or all of the listed elements or a combination of any two or more of the listed elements (e.g., casting and/or treating an alloy means casting, treating, or both casting and treating the alloy).

The phrases "at least one of," "comprises at least one of," and "one or more of" followed by a list refers to any one of the items in the list and any combination of two or more items in the list.

What is claimed is:

1. A system comprising:
an enclosure comprising a front surface, a back surface, a supply plenum, an enclosure outlet adjacent to the back surface, and a device space extending between the front and back surfaces;
an inlet partition including a plurality of apertures providing fluid communication and being positioned between the supply plenum and the device space;
a layer of active devices in the device space defining a plurality of cooling channels aligned to the plurality of apertures, each cooling channel being in the layer adjacent to at least one of the active devices and configured to receive a cooling fluid; and
a fan configured to draw the cooling fluid through the fan and into the enclosure through an enclosure inlet adjacent to the front surface, the fan further configured to provide positive pressure within the enclosure to exhaust the cooling fluid out of the enclosure via the enclosure outlet.

2. The system of claim 1, wherein cooling fluid flows through the plurality of cooling channels in a cooling channel direction orthogonal to a rearward direction from the front surface to the back surface of the enclosure.

3. The system of claim 1, wherein the fan is disposed in or adjacent to a bottom surface of the enclosure.

4. The system of claim 1, further comprising a secondary fan disposed in or adjacent to the enclosure outlet configured to draw cooling fluid through the enclosure outlet from the device space.

5. The system of claim 1, wherein the enclosure and inlet partition are configured to provide an even flow of cooling fluid to each of the cooling channels by having at least one of: (a) apertures that increase in size in a rearward direction from the front surface of the enclosure toward the back surface of the enclosure; (b) apertures that increase in number in the rearward direction; and (c) a supply plenum shape that tapers in the rearward direction.

6. A system comprising:
an enclosure defining a supply plenum, an exhaust plenum, and a device space between the supply plenum and the exhaust plenum;
a layer of active devices arranged into an array having rows and columns in the device space defining a plurality of cooling channels in each row adjacent to the columns configured to receive a cooling fluid, the plurality of cooling channels being configured to receive the cooling fluid adjacent to a first surface of the layer and exhaust the cooling fluid adjacent to a second surface of the layer, the second surface being on an opposite side of the layer than the first surface, the first surface being closer to the supply plenum than the second surface;
an inlet partition including a plurality of apertures, each aperture being aligned to provide the cooling fluid from the supply plenum to one of the cooling channels, the plurality of apertures being arranged into lines parallel to the columns of active devices, each line of apertures having more than one aperture aligned to at least one cooling channel; and
a fan configured to provide a positive pressure in the supply plenum relative to the exhaust plenum and to flow the cooling fluid through the fan.

7. The system of claim 6, further comprising a cooling unit configured to provide recirculated cooling fluid to the supply plenum.

8. The system of claim 6, wherein a thermal gradient profile of the cooling fluid in each row differs by less than 5 degrees C. from the thermal gradient profile of each adjacent row.

9. The system of claim 6, wherein each cooling channel is adjacent to an exterior surface of at least one of the active devices.

10. The system of claim 6, wherein the inlet partition is a printed circuit board electrically coupled to the plurality of active devices.

11. The system of claim 6, wherein the enclosure comprises a plurality of row partitions in the layer of active devices, each of the row partitions separating cooling channels in adjacent rows.

12. The system of claim 6, wherein the cooling channels in the same row have the same number of apertures aligned to each of the cooling channels.

13. The system of claim 6, further comprising a plurality of enclosures including the enclosure, each enclosure comprising a supply plenum and an exhaust plenum, the plurality of enclosures mounted to a rack rail, each enclosure configured to flow cooling fluid flowing from the supply plenum to the exhaust plenum in a direction parallel to the rack rail.

14. The system of claim 6, wherein the supply plenum includes a primary plenum and a plurality of elongate ducts, each elongate duct extending adjacent to a line of the plurality of apertures, each elongate duct having a first end adjacent to the primary plenum and a second end opposite the first end.

15. The system of claim 14, wherein at least one elongate duct includes a duct partition dividing the first end of the elongate duct into a first duct space and a second duct space, the duct partition extending toward and terminating short of the second end of the elongate duct forming an end space at the second end of the duct, the first duct space being adjacent to the line of apertures.

16. The system of claim 14, wherein the supply plenum includes a secondary plenum adjacent to the second end of the elongate ducts in fluid communication with the primary plenum via a dedicated supply duct.

17. A method comprising:
flowing a cooling fluid into a supply plenum adjacent to a device space having a plurality of active devices comprising data storage devices arranged into a layer of active devices comprising a series of rows;
transferring cooling fluid from the supply plenum to the device space through a plurality of apertures in an inlet partition separating the supply plenum and the device space;
transferring cooling fluid into a plurality of cooling channels in the device space, the plurality of cooling channels being configured to receive the cooling fluid adjacent to a first surface of the layer and exhaust the cooling fluid adjacent to a second surface of the layer, the second surface being on an opposite side of the layer than the first surface, the first surface being closer to the supply plenum than the second surface; and
removing cooling fluid from a plurality of cooling channels in each row adjacent to the active devices of the row to provide a thermal gradient profile of the cooling fluid in each row differing by less than 5 degrees C.

18. The method of claim 17, further comprising dividing the flow of cooling fluid to each row equally among the plurality of cooling channels in the row, each cooling channel in the row being aligned to an equal number of the plurality of apertures in the inlet partition.

19. The method of claim 17, further comprising dividing the cooling fluid into a plurality of elongate ducts in the supply plenum, the plurality of apertures in the inlet partition being arranged into a plurality of lines, each elongate duct aligned to one of the lines of apertures.

20. The system of claim 1, wherein each cooling channel defines a width and each aperture aligned to the cooling channel defines a width less than the width of the corresponding cooling channel.

21. The system of claim 1, wherein the plurality of cooling channels are configured to receive the cooling fluid adjacent to a first surface of the layer and exhaust the cooling fluid adjacent to a second surface of the layer, the second surface being on an opposite side of the layer than the first surface, the first surface being closer to the supply plenum than the second surface.

22. The system of claim 6, wherein each of the apertures aligns to one of the cooling channels and defines a width less than a width of the corresponding cooling channel.

23. The method of claim 17, wherein each of the apertures aligns to one of the cooling channels and defines a width less than a width of the corresponding cooling channel.

* * * * *